United States Patent
Nessi et al.

(10) Patent No.: US 8,174,292 B2
(45) Date of Patent: May 8, 2012

(54) CURRENT SENSING CIRCUIT FOR PWM APPLICATIONS WITH PULSE WIDTH MODULATION AND CORRESPONDING CURRENT PROCESS

(75) Inventors: Maurizio Nessi, Como (IT); Luca Schillaci, Belgioioso (IT)

(73) Assignee: STMicroelectronics, S.R.L., Agrate Brianza (MI) (IT)

( * ) Notice: Subject to any disclaimer, the term of this patent is extended or adjusted under 35 U.S.C. 154(b) by 128 days.

(21) Appl. No.: 12/541,468

(22) Filed: Aug. 14, 2009

(65) Prior Publication Data

US 2010/0066413 A1  Mar. 18, 2010

(30) Foreign Application Priority Data

Sep. 12, 2008 (IT) .............................. MI2008A1632

(51) Int. Cl.
*H02M 11/00* (2006.01)
*H03F 3/45* (2006.01)

(52) U.S. Cl. ........................... 327/103; 327/65; 327/563

(58) Field of Classification Search .................... 327/87, 327/89, 103, 560, 563, 65, 77–79; 330/85, 330/253

See application file for complete search history.

(56) References Cited

U.S. PATENT DOCUMENTS

| | | | |
|---|---|---|---|
| 4,885,517 A | 12/1989 | Pennock | 318/678 |
| 5,999,052 A | 12/1999 | Tang | 330/254 |
| 6,072,339 A | 6/2000 | Bertolini | 327/54 |
| 6,420,910 B1 | 7/2002 | Contreras et al. | 327/77 |
| 6,479,954 B1 * | 11/2002 | Peritore et al. | 318/687 |
| 6,606,212 B1 | 8/2003 | Klaassen et al. | 360/67 |
| 7,145,395 B2 * | 12/2006 | Gudem et al. | 330/283 |
| 7,327,129 B2 | 2/2008 | Chen et al. | 323/285 |
| 7,463,443 B2 | 12/2008 | Schillaci | 318/254 |
| 2002/0057130 A1 * | 5/2002 | Iigai et al. | 327/563 |
| 2003/0011430 A1 * | 1/2003 | Kruiskamp | 330/253 |
| 2004/0183598 A1 * | 9/2004 | Behzad | 330/253 |

OTHER PUBLICATIONS

Pallás-Areny, Ramón et al., "Common Mode Rejection Ratio in Differential Amplifiers," IEEE Transactions on Instrumentation and Measurement, vol. 40, No. 4, Aug. 1991; pp. 669-676.

* cited by examiner

*Primary Examiner* — Quan Tra
(74) *Attorney, Agent, or Firm* — Allen, Dyer, Doppelt, Milbrath & Gilchrist, P.A.

(57) ABSTRACT

A current sensing circuit for a pulse width modulation (PWM) application may include first and second input terminals to be coupled to ends of a sensing resistance, an output terminal, and first and second internal circuit nodes. The current sensing circuit further may include an input block comprising a first transconductance amplifier to be coupled to a supply voltage. The first transconductance amplifier may be coupled to the first and second input terminals and to the first and second internal circuit nodes. The current sensing circuit may also include an amplifier block comprising an amplifier to be coupled to a reference voltage, and coupled to the first and second internal circuit nodes and the output terminal, and a feedback block comprising a second transconductance amplifier to be coupled to the supply voltage and being coupled to the output terminal and the first and second internal circuit nodes. The input block may further include a third transconductance amplifier coupled in cascade to the first transconductance amplifier and to the first and second input terminals.

21 Claims, 7 Drawing Sheets

FIG. 1
*(PRIOR ART)*

Vout/Vin=Gm1/Gm2*(1+R2/R1)

CURRENT SENSING CIRCUIT FOR PWM APPLICATIONS WITH PULSE WIDTH MODULATION AND CORRESPONDING CURRENT PROCESS

FIELD OF THE INVENTION

The present invention relates to a current sensing circuit for pulse width modulated (PWM) applications, more particularly, the current sensing circuit uses transconductance amplifiers.

BACKGROUND OF THE INVENTION

Current sensing circuits typically are used in multiple applications, for example, voice coil motors, and in particular, in the current loop control devices for driving coils in these motors. These control devices comprise typically at least one current sensing circuit, also called a sense amplifier, which senses a current flowing through a suitable current-sense resistor associated with the coils of the motor. In these devices, and feedback drives the coils. Voice coil motors are used in high performance applications at high operating frequencies.

To reduce the power consumption in these applications, the coils of the motor may be driven by way of a current alternated switching from a linear standard mode to a pulse width modulation mode (PWM). In particular, the standard mode is used when the coils run currents with reduced amperage, switching to the PWM mode when currents with high amperage are run.

For example, in applications where the current reading is for memory storage support services, for example, in a hard disk drive, the current is modulated in the PWM mode during the so called track seek operations, switching to the linear standard mode during the track following operations.

A parameter that can limit the performance of the current loop control device, in applications with PWM currents, is common mode rejection ratio (CMRR). In fact, as is typical, a low CMRR introduces an additional signal in the current feedback depending on the voltage value of the input common mode and moreover, at the high operation frequencies, the CMRR parameter could reduce the phase margin of the passing band of the device itself, thereby jeopardizing its performance.

In particular, to avoid the influence of the output voltage of the current loop control device interfering or limiting the current in the coil of the motor, it is helpful for this output voltage to be independent from the common mode voltage at the input of the current sensing circuit. In these applications, the current loop control device and, in particular, the current sensing circuit, may show an input offset being as low as possible.

Figure 1:
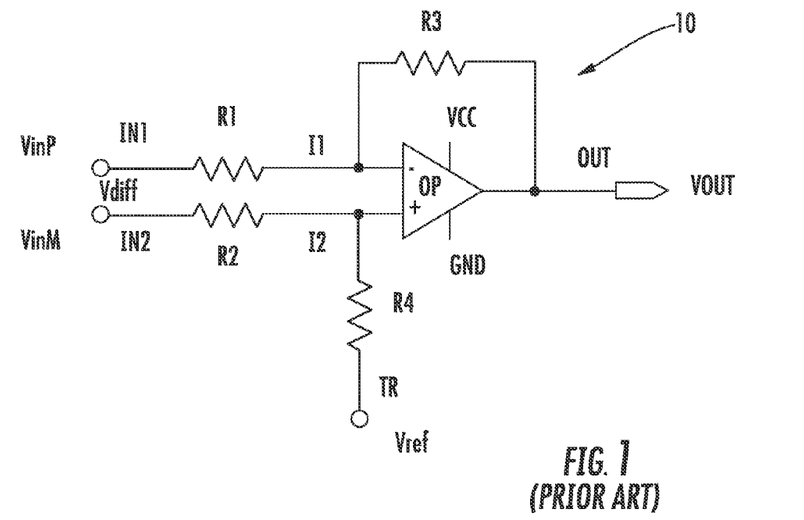
FIGS. 1 and 2 show respective sensing circuits, according to the prior art.

The current sensing circuit, in the typical approach, comprises standard differential amplifiers and structures of the Gm/Gm type. A typical scheme for a differential amplifier used in a current sensing circuit 10 for applications to voice coil motors is shown in FIG. 1. The sensing circuit 10 comprises, in particular, an operational amplifier OP and four resistors Ri i=1 ... 4, which define a gain of the operational amplifier OP.

The operational amplifier OP is connected to a terminal, placed at a supply voltage Vcc, and a ground terminal Gnd, placed at the ground voltage, and has a first input terminal I1, in particular, inverting (−), connected to a first input terminal IN1 through a first resistance R1, a second input terminal I2, in particular non inverting (+), connected to a second input terminal IN2 through a second resistance R2, and an output terminal Out on which an output voltage signal is generated Vout. An input differential voltage Vdiff is applied to these first IN1 and second input terminals IN2.

The sensing circuit 10 comprises a third resistance R3 feedback connected between the output terminal Out and the first inverting input terminal I1 of the operational amplifier OP, as well as a fourth resistance R4 inserted between the second non-inverting input terminal I2 of the operational amplifier OP and a reference terminal TR receiving a reference voltage Vref.

Although advantageous, this approach for the current sensing circuit for applications of the above indicated type has some limits, in particular, to the CMRR parameter, which is influenced by the value of the resistances connected to the operational amplifier OP. In fact, considering the common mode voltage at the input terminals IN1 and IN2 has a similar value to the reference voltage Vref, the current that flows through the third feedback resistance R3 is low and thus the output voltage Vout, generated at the output terminal Out, remains almost equal to a value, in particular, the reference voltage value Vref.

However, by increasing the value of the input common mode voltage up to the value of supply voltage Vcc, for example, about 12V, a mismatch of the resistances R1-R4 occurs, a current flows in the third feedback resistance R3, and the output voltage Vout increases with respect to the reference voltage value Vref, thus determining an output signal Vout, although a differential input signal Vdiff equal to zero is present.

In the illustrated example of the sensing circuit 10, the worst value of the CMRR parameter due to the coupling of the resistances R1-R4, without considering any contribution of the operational amplifier OP, results from the formula:

$$CMRR = \frac{K+1}{4t}$$

where: K is the total gain of the operational amplifier OP; and t is a realization tolerance or matching coefficient of the resistances R1-R4 in the sensing circuit 10.

A practical example of calculation of the coefficient t and thus of the value of CMRR is provided by the following formula:

$$t = \frac{11\%}{\sqrt{WL}} = \frac{11\%}{\sqrt{16*280}} = 0.165\% \text{ at } 1\delta (0.66\% \text{ at } 4\delta)$$

where W and L indicate the sizes of an area occupied by the resistors.

For the sensing circuit 10, realized as shown in FIG. 1, the maximum value of CMRR is equal to:

$$CMRR = \frac{K+1}{4t} = \frac{3}{4*0.0066} = 41 \text{ dB}$$

It is to be noted that, according to this embodiment, by doubling the value of the area occupied by the resistors R1 and R3, the value of CMRR would take the maximum value of 44 dB against an area occupied by the circuit being, as a whole, excessively high. From this analysis, it is clear to a skilled person how the use of the resistances of the trimming type to reach at least a value of CMRR equal to 60 dB, with the configuration shown in FIG. 1.

Figure 3:
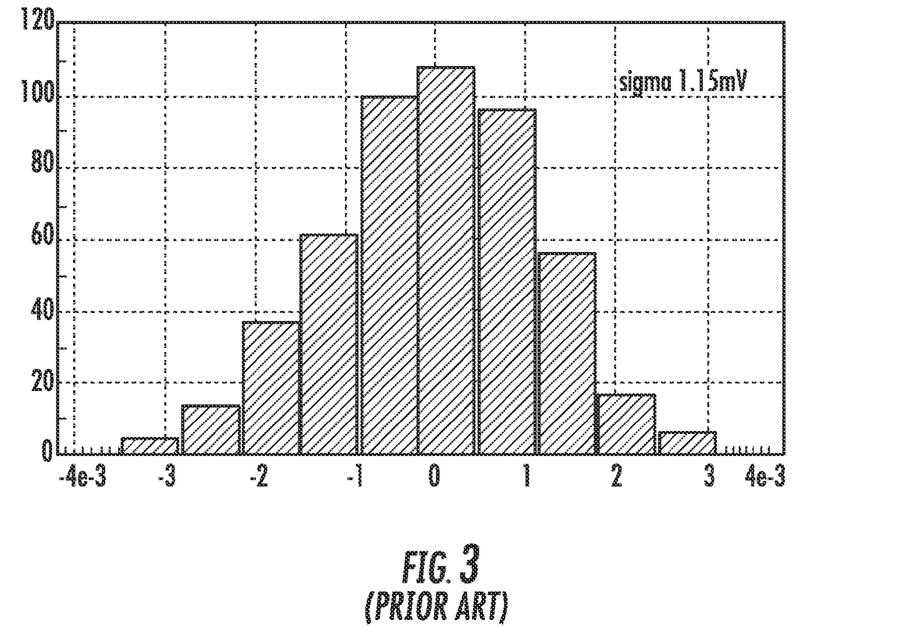
FIGS. 3 and 4 show Montecarlo diagrams for the circuit of FIG. 1.
Figure 4:
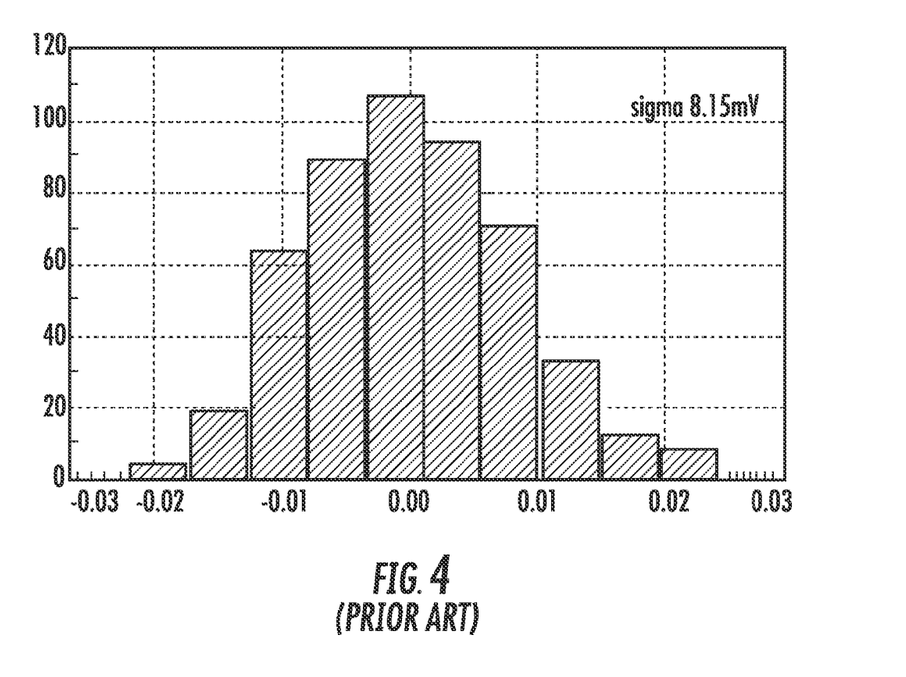

FIGS. 3 and 4 show two diagrams obtained by so called Montecarlo analysis carried out on the sensing circuit 10 of FIG. 1, where the offset of this circuit is shown according to a first input voltage value equal to O V and to a second input voltage value equal to 13.2 V.

From a comparison of these diagrams one can evaluate how a mismatch of the resistances R1 and R3 can affect the value of the output voltage Vout. In particular, considering the relation:

$$\text{Output variation} = \frac{(8.15 \text{ mV} - 1.15 \text{ mV}) * \text{Gain}}{13.2 \text{ V}}$$
$$= 1.06 \text{ m} * 4\sigma$$
$$= -48 \text{ dB}$$

and a differential gain of the circuit equal to two, the value can be calculated of the variation of the output voltage Vout in decibel (Output variation) and the corresponding value of CMRR:

CMRR=−48 dB−[Gain(dB)]=−48 dB−20 Log 2=−54 dB.

Figure 5:
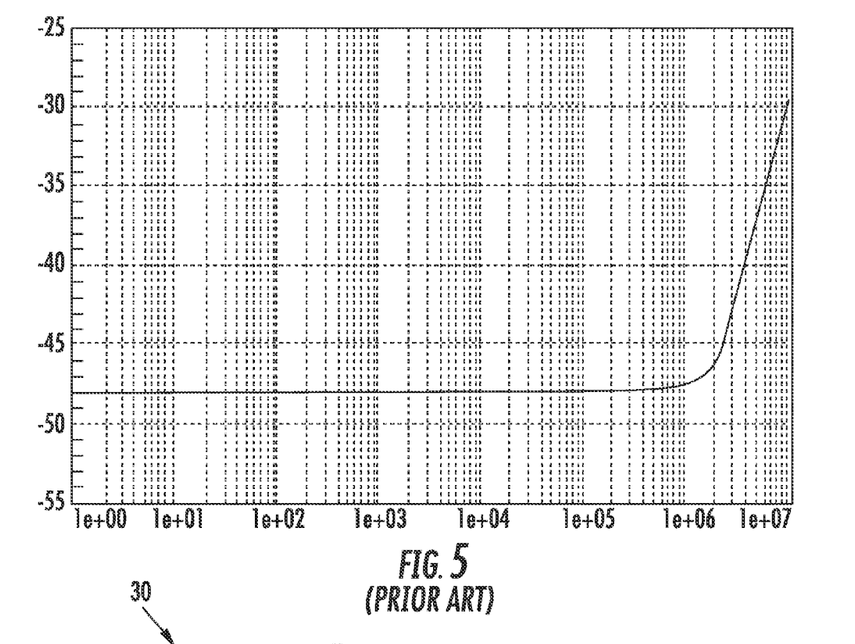
FIG. 5 shows the output voltage of the circuit of FIG. 2 supplied by an alternated current.

FIG. 5 shows a diagram, which reports the progress of the reduction of the output voltage Vout of the sensing circuit 10 supplied by an alternated current and having a mismatch value of the resistances R1 and R3 equal to 0.65%, which represents the worst case. As it can be noted, after a transient, there is a reduction at the output equal to −48 dB and results confirm the variation value of the output voltage Vout previously calculated.

From this analysis, it can be deducted how to ensure a value of CMRR equal to −60 dB in a high frequency field without excessive impact on the value of the occupied silicon area, it may be necessary to completely change the architecture of the sensing circuit 10. In an implementation of the current sensing circuit 20, shown in FIG. 2, some resistances are realized in the High Ohmic Poly Cristalline (HIPO) mode and suitable transconductance elements Gm1 and Gm2 have been introduced.

Figure 2:
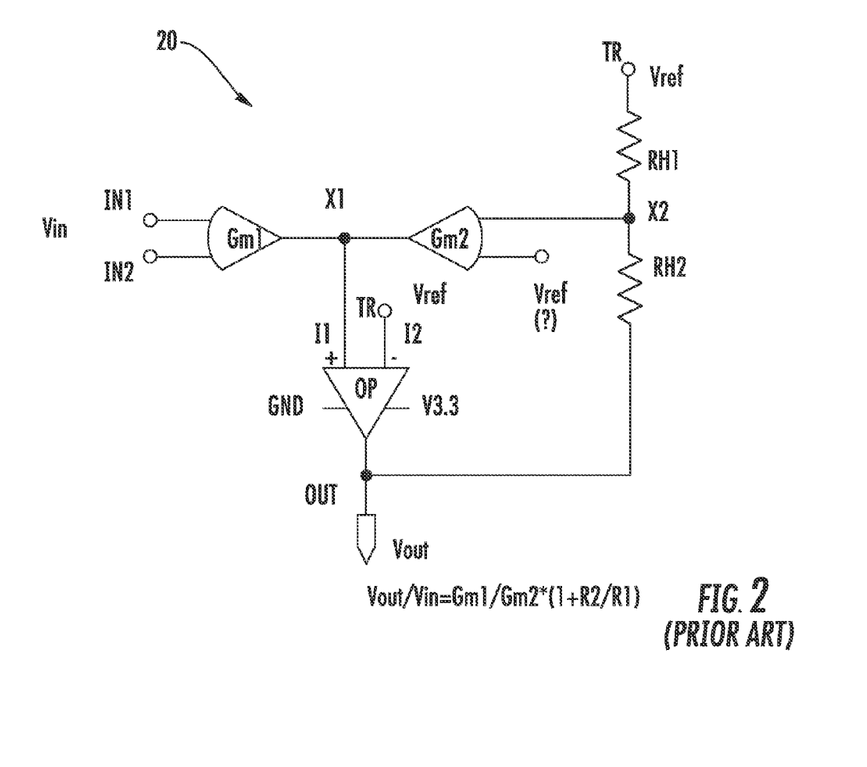

The sensing circuit 20 comprises the operational amplifier OP, in turn having the first input terminal I1, non-inverting, connected to a first internal circuit node X1 and the second input terminal I2, inverting, connected to the reference terminal TR receiving the reference voltage Vref. Moreover, the sensing circuit 20 comprises a first transconductance element Gm1 having respective input terminals connected to the input terminals IN1 and IN2 of the circuit, and an output terminal connected to the first internal circuit node X1, as well as a second transconductance element Gm2 having a first input terminal connected to a second internal circuit node X2, a second input terminal connected to the reference terminal TR, and an output terminal connected to the first internal circuit node X1. Finally, the sensing circuit 20 comprises a fifth resistance RH1, of the HIPO type, inserted between the reference terminal TR and the second internal circuit node X2, and a second resistance RH2 of the HIPO type inserted between the second internal circuit node X2 and the output terminal Out.

Figure 6:
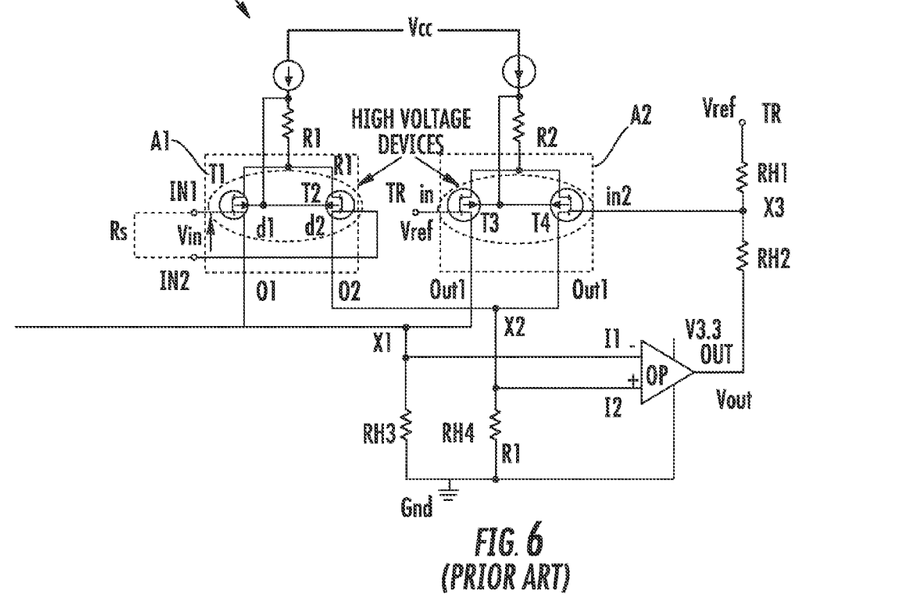
FIG. 6 shows another embodiment of the circuit of FIG. 2.

Another embodiment of the approach illustrated in FIG. 2 is shown in FIG. 6, as disclosed in U.S. Pat. No. 6,072,339 to Bertolini, also assigned to the assignee of the present application. In particular, the sensing circuit 30 comprises a so called Gm/Gm stage, substantially realized according to the scheme of FIG. 2, with a feedback that sets the gain to improve the value of CMRR, i.e. the rejection of input common mode.

The sensing circuit 30 comprises a operational amplifier OP having the first inverting input terminal I1 connected to the first internal circuit node X1 and the second input terminal I2, non inverting, connected to a second internal circuit node X2. Moreover, the sensing circuit 30 comprises a first transconductance amplifier A1 having respective input terminals connected to the input terminals IN1 and IN2 of the current sensing circuit 30, and a first and a second output terminal O1, O2 respectively connected to the first circuit node X1 and to the second circuit node X2. The first transconductance amplifier A1 is supplied by a supply voltage Vcc.

In particular, the first transconductance amplifier A1 comprises two transistors T1 and T2 (MOSFET with P channel) that have respective first conduction terminals connected to the supply voltage Vcc through a first biasing resistance R1, respective command terminals connected to the input terminals IN1 and IN2, and respective second conduction terminals which define the output terminals O1 and O2 of the first amplifier A1. Finally, the two transistors T1 and T2 have body terminals connected to each other as well as connected to the positive terminal of the resistance R1.

The sensing circuit 30 comprises a second transconductance amplifier A2. The transconductance amplifier A2 is supplied by the supply voltage Vcc, has a first input terminal in1 connected to a reference terminal TR, receives a reference voltage Vref, and has a second input terminal in2 connected to a third internal circuit node X3. Moreover, the second transconductance amplifier A2 has a first output terminal out1 connected to the first circuit node X1 and a second output terminal out2 connected to the second internal circuit node X2.

In particular, the second transconductance amplifier A2 comprises two transistors T3 and T4 (MOSFET with P channel) that show respective first conduction terminals connected to the supply voltage Vcc through a second biasing resistor R2, command terminals respectively connected to the first in1 and to the second in2 input terminal, as well as respective second conduction terminals, which define the output terminals out1 and out2 of the second amplifier A2. Moreover, the two transistors T3 and T4 have bulk terminals connected to each other as well as to the positive terminal of the resistor R2.

Further, the sensing circuit 30 comprises a first division resistance HIPO RH1 inserted between the reference terminal TR and the third internal circuit node X3, and a second division resistance HIPO RH2 inserted between the third internal circuit node X3 and the output terminal Out. Finally, the sensing circuit 30 comprises a first ground resistor RH3 inserted between the first circuit node X1 and a ground terminal and a second ground resistor RH4 inserted between the second circuit node X2 and the ground terminal Gnd.

According to the present approach, the input terminals IN1 and IN2 of the sensing circuit 30 are connected across a sensing resistor Rs, shown in FIG. 6. The voltage fall on this sensing resistor Rs shows an input differential voltage Vin applied to the input terminals IN1 and IN2 of the sensing circuit 30.

In the present approach, an improved value of CMRR is obtained, i.e. higher, with respect to the value obtained with the use of standard differential amplifiers, for example, the sensing circuit 10 shown in FIG. 1 and described above. This is the result of the presence of the first transconductance amplifier A1 and of the second transconductance amplifier A2.

By using a current sensing circuit in current loop control devices with pulse with input modulation or PWM with typical applications, it may be necessary to ensure a same value of the parameter CMRR for input voltages, which may vary in a range between a null voltage value and a voltage value higher than the supply voltage Vcc. For example, in the case of input voltages varying between −1 V and 14.2 V and a maximum supply voltage Vcc equal to 13.2 V, it may be necessary to ensure a value of the parameter CMRR of at least 70 dB.

In this case, the sensing circuit 30 has some drawbacks. In fact, when the voltages at the input terminals IN1 and IN2 change suddenly, a current flowing in the sense resistor Rs is present, and thus a differential signal is also present, the signal between the maximum value and the minimum value, for example, between 14 V and −1 V, at the input terminals of the two transistors T1 and T2, of the first transconductance amplifier A1. Different voltages are applied, which lead the transistors T1 and T2 to a different biasing state with respect to each other.

In particular, the first transconductance amplifier A1 operates like an open circuit and the two transistors T1, T2 show an inbalance in current. This implies that the signals generated at the output terminals O1, O2 of the first transconductance amplifier A1 propagate in a completely different way with respect to each other in comparison with the transistors T1, T2 being in a balanced state, i.e. they are controlled by voltages present at the input terminals IN1, IN2 that are substantially corresponding.

SUMMARY OF THE INVENTION

The technical problem underlying the present invention is that of devising an improved current sensing circuit having such structural and functional characteristics as to show excellent performance in applications with PWM, thereby overcoming the limits and the drawbacks still affecting the circuits realized according to the prior art.

The approach underlying the present invention is that of making the signals generated inside the current sensing circuit independent from the pulse modulation switch of the current or of the voltage applied to the input terminals of the circuit itself by a level shifter placed at the input of the sensing circuit.

On the basis of this approach, an approach to the technical problem is provided by a current sensing circuit for PWM applications comprising a first and a second input terminal respectively connected at the extremities of a sensing resistor and an output terminal suitable for feedback driving a current. The current sensing circuit further comprises an input block having a first transconductance amplifier powered by a supply voltage and coupled to the first and second input terminals and to a first and a second internal circuit node, an amplifier block having an operational amplifier connected to a ground terminal and coupled to the first and second internal circuit nodes and to the output terminal, and a feedback block having a second transconductance amplifier powered by the supply voltage and coupled to the output terminal and the first and second internal circuit nodes. The input block comprises a third transconductance amplifier placed in cascade to the first transconductance amplifier and further coupled to the first and second input terminals.

The advantage of this current sensing circuit lies in the improved CMRR. In fact, the presence of the third transconductance amplifier placed in cascade to the first transconductance amplifier allows balance for the switches of the differential voltage sensed across the sensing resistor.

Another aspect is directed to a process for sensing a current for PWM applications comprising sensing a current that flows in a sensing resistor by an input block of a sensing circuit comprising a first transconductance amplifier, processing the sensed current by an amplifier block comprising an operational amplifier connected to the input block and to an output terminal of the sensing circuit, and feedback driving the amplifier block by a feedback block comprising a second transconductance amplifier connected to the output terminal and to the amplifier block. The sensing of the current that flows in the sensing resistor occurs with a third transconductance amplifier in cascade to the first transconductance amplifier and coupled to the amplifier block.

The characteristics and advantages of the current sensing circuit according to the present invention may be apparent from the following description of an embodiment thereof given by way of indicative and non-limiting example with reference to the annexed drawings.

DETAILED DESCRIPTION

Figure 7:
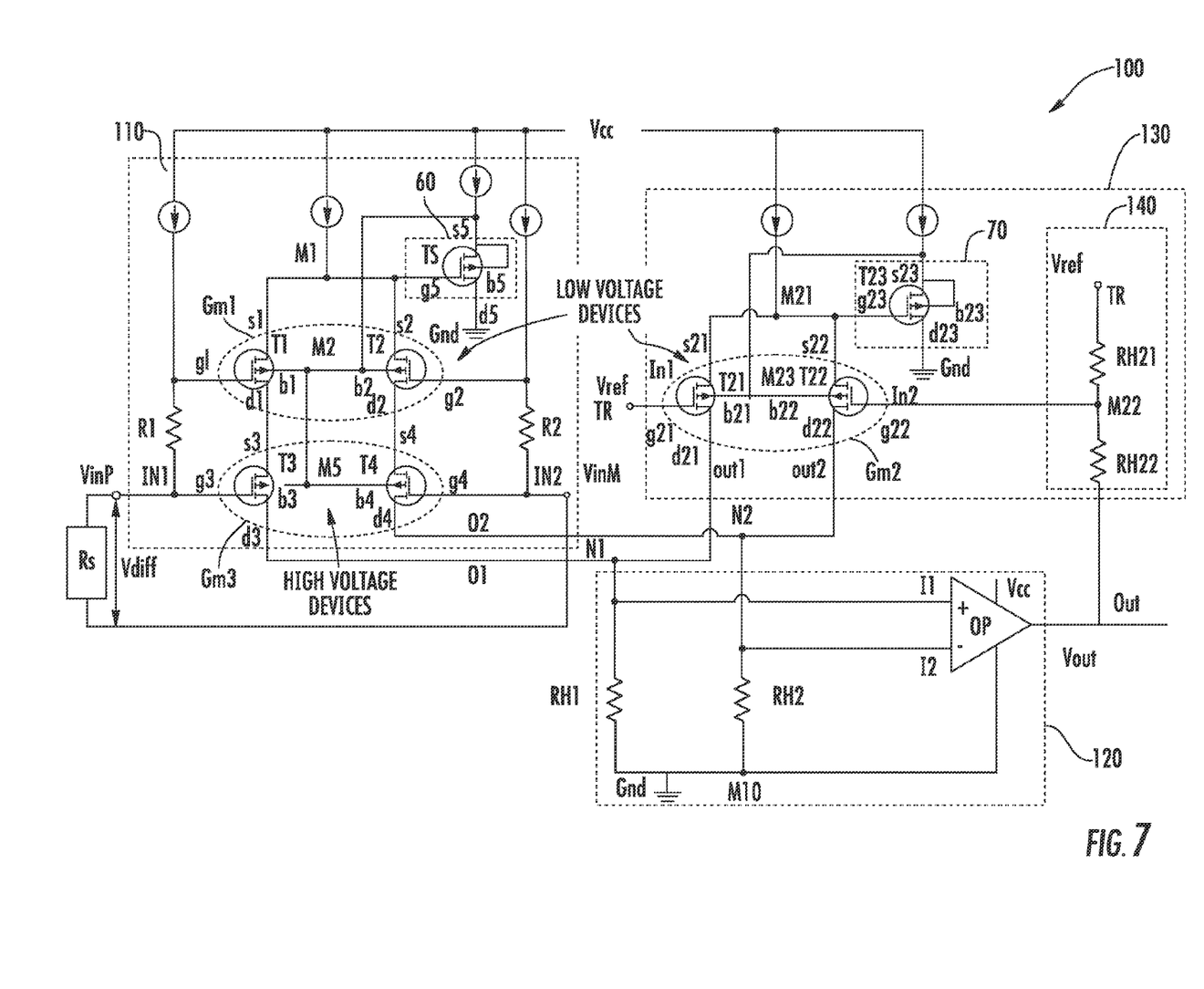
FIG. 7 shows a current sensing circuit, according to the present invention.

More specifically, the present invention relates to a current sensing circuit comprising a first and a second input terminal respectively connected to the ends of a sensing resistor Rs and an output terminal Out suitable for feedback driving a current. The sensing circuit comprises an input block having a first transconductance amplifier powered by a supply voltage and interposed between the first and the second input terminals and first and second internal circuit nodes. The current sensing circuit also includes an amplifier block having an operational amplifier connected to a ground terminal and coupled to the first and second internal circuit node and to the output terminal of the sensing circuit, and a feedback block having a second transconductance amplifier powered by the supply voltage and coupled to the output terminal and to the first and second internal circuit nodes.

With reference to these FIGS. 7-10, a current sensing circuit 100 for PWM applications, for example, electric motors of the voice coil or VCM type, according to the present invention is now described. The sensing circuit 100 is suitable for sensing a current that flows in a sensing resistance Rs, which is associated with the coils of the electric motor of the voice coil type.

In particular, the current that flows in the sensing resistance Rs shows a modulated waveform with PWM. The sensing circuit 100 is of the type as previously described for which details and cooperating parts having the same structure and function may be indicated with the same reference numbers and references. The sensing circuit 100 is supplied by a terminal placed at a supply voltage Vcc and is connected to a ground terminal Gnd placed at a reference voltage which, in particular, is a ground.

Moreover, the sensing circuit 100 has a first input terminal IN1 and a second input terminal IN2 connected to the extremities of the sensing resistance Rs, as well as an output terminal Out suitable for generating an output voltage Vout which is used for feedback driving the current that flows in the motor coils. In particular, the first input terminal IN1 receives a first voltage VinP and the second input terminal IN2 receives a second voltage VinM whose difference, or differential voltage Vdiff, is given by the voltage fall across the sensing resistance Rs.

The sensing circuit 100 comprises an input block 110 having respective input terminals connected to the first input terminal IN1 and to the second input terminal IN2 of the sensing circuit 100, and a first and a second output terminal O1, O2 respectively connected to a first node N1 and to a second internal circuit node N2.

Moreover, the sensing circuit 100 comprises an amplifier block 120, which has an operational amplifier OP supplied by the supply voltage Vcc and connected to the ground terminal Gnd. The operational amplifier 120 has a first input terminal I1, non-inverting, connected to the first internal circuit node N1, a second input terminal I2, inverting, connected to the second internal circuit node N2, as well as an output terminal connected to the output terminal Out of the sensing circuit 100.

Moreover, the amplifier block 120 comprises a fifth resistance RH1 inserted between the first internal circuit node N1 and the ground terminal Gnd, as well as a sixth resistance RH2 inserted between the second internal circuit node N2 and the ground terminal Gnd. Finally, the sensing circuit 100 comprises a feedback block 130 connected to the output terminal Out of the circuit, to the first node N1, and to the second internal circuit node N2. In particular, the feedback block 130 has a first input terminal in1 connected to a reference terminal TR receiving a reference voltage Vref and a second input terminal in2 receiving a portion of the output voltage Vout.

Moreover, the feedback block 130 has a first output terminal out1 and a second output terminal out2 respectively connected to the first internal circuit node N1 and to the second internal circuit node N2 of the sensing circuit 100.

According to the present invention, the input block 110 of the sensing circuit 100 comprises a first transconductance amplifier Gm1 having a first transistor T1 and a second transistor T2, in particular of the MOSFET type with P channel, which have respective first conduction terminals, s1 and s2, connected to each other in correspondence with a third node N3, of the input block 110, supplied by the supply voltage Vcc.

Moreover, the first transistor T1 has a command terminal g1 supplied by the supply voltage Vcc and connected to the first input terminal IN1, of the sensing circuit 100, by way of the interposition of a first resistance R1. Similarly, the second transistor T2 has a command terminal g2 supplied by the supply voltage Vcc and connected to the second input terminal IN2 by way of the interposition of a second resistance R2. Moreover, the first transistor T1 and the second transistor T2 have respective second conduction terminals d1 and d2 connected to the first output terminal O1 and to the second output terminal O2 of the input block 110.

Finally, the first T1 and the second transistor T2 have body or bulk terminals, b1 and b2, connected to each other and supplied by the supply voltage Vcc. In the present embodiment, the command terminal is the gate terminal, the first conduction terminal is the source terminal, and the second conduction terminal is the drain terminal.

The feedback block 130, of the sensing circuit 100, comprises a second transconductance amplifier Gm2 having a sixth transistor T6 and a seventh transistor T7 (MOSFET with P channel) that have respective first conduction terminals s6 and s7 connected to each other in correspondence with a fourth node N4, which is supplied by the supply voltage Vcc.

Moreover, the sixth transistor T6 has a command terminal g6 connected to the first input terminal in1 of the feedback block 130, and the seventh transistor T7 has a command terminal g7 connected to the second input terminal in2 of the feedback block 130, which, in particular, is connected to the output terminal Out together with a division element 140. In particular, the partition element 140 has a third division resistor RH21 in series to a fourth division resistor RH22 connected in turn to the output terminal Out of the sensing circuit 100. The third division resistor RH21 is also connected to the reference terminal TR and to the second input terminal in2 of the feedback block 130.

Moreover, the sixth transistor T6 and the seventh transistor T7, of the second transconductance amplifier Gm2, have second conduction terminals, d6 and d7, connected, respectively, to the first node N1 and to the second internal circuit node N2 of the sensing circuit 100. Finally, the sixth T6 and the seventh transistor T7 have bulk or body terminals, respectively b6 and b7, connected to each other and supplied by the supply voltage Vcc.

Advantageously, the input block 110 of the sensing circuit 100 comprises a third transconductance amplifier Gm3 placed in cascade to the first transconductance amplifier Gm1. The third transconductance amplifier is inserted in between the second conduction terminals, d1 and d2, of the first transistor T1 and of the second transistor T2 of the first transconductance amplifier Gm1 and the first and the second input terminals IN1 and IN2 of the sensing circuit 100.

In particular, the first transconductance amplifier Gm1 and the second transconductance amplifier Gm2 comprise low voltage or LV transistors while the third transconductance amplifier Gm3 comprises high voltage or HV transistors.

In particular, according to the present embodiment, the third transconductance amplifier Gm3 has a third transistor T3 and a fourth transistor T4 (MOSFET type with P channel) having respective first conduction terminals, s3 and s4, connected to the respective second conduction terminals, d1 and d2, of the first transistor T1 and of the second transistor T2. The third transistor T3 and the fourth transistor T4 also have a second conduction terminal d3, d4 connected respectively to the first internal circuit node N1 and to the second internal circuit node N2. Moreover, the third transistor T3 has a command terminal g3 connected to the first input terminal IN1 of the sensing circuit 100, while, the fourth transistor T4 has a command terminal g4 connected to the second input terminal IN2 of the sensing circuit 100.

Finally, the third transistor T3 and the fourth transistor T4 have body terminals, b3 and b4, connected to each other and coupled to the body terminals b1 and b2 of the first transistor T1 and of the second transistor T2. In particular, according to the present embodiment, the third transconductance amplifier Gm3 represents, for the input block 110, a level shifter of the voltages present at the second conduction terminals, d1 and d2, of the first and of the second transistor T1 and T2, of the first transconductance amplifier Gm1, and suitably allows for maintaining the voltages at the first node N1 and at the second internal circuit node N2 substantially low independently from the differential voltage Vdiff present at the first input terminal IN1 and at the second input terminal IN2.

In other words, the presence of the third transconductance amplifier Gm3, in the input block 110, in cascade to the first transconductance amplifier Gm1, allows to ensure excellent performance both in the presence of the first and of the second voltage VinP and VinM with a low common mode value and with a high common mode value.

The approach according to the present embodiments, as it is clear for the skilled person in that art, advantageously allows the first transconductance amplifier Gm1, of the input block 110, and the second transconductance amplifier Gm2, of the feedback block 130, to be low voltage devices and only realizing the third transconductance amplifier Gm3, of the input block 110, as high voltage device.

In particular, with an input differential voltage Vdiff sensed by the input block 110 of the sensing circuit 100, which takes negative values, equal for example to −1V, the third transistor T3 and the fourth transistor T4 of the third transconductance amplifier Gm3 of the input block 110 work with low voltages at the first node N1 and at the second internal circuit node N2 of the sensing circuit 100, although maintaining the transistors T1 and T2 in a correct biasing state.

When the differential voltage Vdiff at the input of the sensing circuit 100 increases, for example at a value of 14V, the third transistor T3 and the fourth transistor T4, of the third transconductance amplifier Gm3, ensure a constant voltage between the second conduction terminals d1, d2 and the first conduction terminals of the first transistor T1 and the second transistor T2, ensuring in this way a constant output signal, i.e. a constant voltage at the first node N1 and the second internal circuit node N2. Moreover, the presence of the third transconductance amplifier Gm3, in the input block 110, realized according to the present disclosure, allows considerable improvement to the common-mode rejection ratio (CMRR) of the sensing circuit 100.

According to another aspect of the present disclosure, the input block 110, of the sensing circuit 100, comprises a first biasing element 60, interposed between the terminal connected to the supply voltage Vcc and the ground terminal Gnd suitable for biasing the first transistor T1 and the second transistor T2 acting on the value of the voltage on the respective first conduction terminals s1, s2. In particular, the first biasing element 60 of the input block 110 comprises a fifth transistor T5 having a first conduction terminal s5 connected to the supply voltage Vcc, a command terminal g5 connected to the third circuit node N3 of the input block 110, and a second conduction terminal d5 connected to the ground terminal Gnd. Even more, the fifth transistor T5 has a body terminal b5 connected to its own first conduction terminal s5, i.e. to the supply voltage Vcc.

Similarly, the feedback block 130 comprises a second biasing element 70, interposed between the supply voltage Vcc and the ground terminal Gnd, for biasing the sixth transistor T6 and the seventh transistor T7 acting on the value of the voltage on the respective first conduction terminals s6 and s7s. The second biasing element 70 comprises an eighth transistor T8 having a first conduction terminal s8 connected to the supply voltage Vcc, a command terminal g8 connected to the fourth node N4, a second conduction terminal d8 connected to the ground terminal Gnd, and a body terminal b8 connected to the first conduction terminal s8 i.e. to the supply voltage Vcc.

Figure 8:
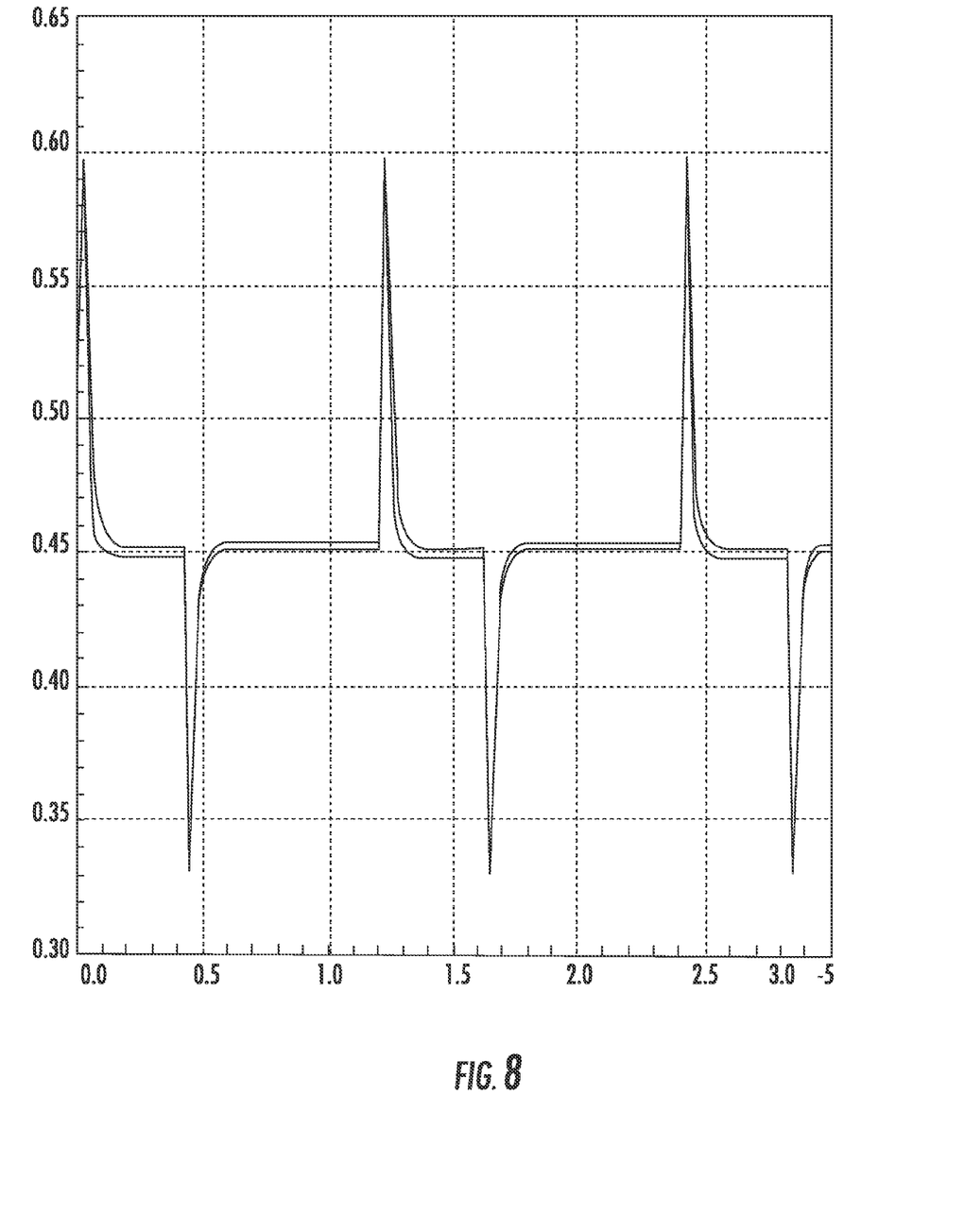
FIG. 8 shows a diagram for the output voltage versus time of the circuit of FIG. 6 and the output voltage versus time of the circuit according to the present invention.

The first biasing element 60 of the input block 110 and the second biasing element 70 of the feedback block 130 ensure an increase of the threshold voltage of the first transistor T1 and of the second transistor T2, of the first transconductance amplifier Gm1, and of the sixth transistor T6 and of the seventh transistor T7, of the second transconductance amplifier Gm2, ensuring in the meantime, a low impedance in correspondence with the respective first conduction terminals, which, in turn upgrades the performance at high operating frequencies, thereby ensuring a low coupling with possible parasitic capacitances. FIG. 8 shows a simulation between the sensing circuit realized according to the present invention and a circuit realized according to the prior art scheme, indicated in FIG. 6 and previously described.

In the present simulation, a modulation of the input voltage with a pulse width PWM from 0V to 13.6V, a differential input voltage equal to 600 mV, a switch time of 200 ns, a reference voltage of Vref equal to 1.65V, and an overall gain of the sensing circuit 100 equal to 2, have been taken into consideration in a dual mode.

Figure 9:
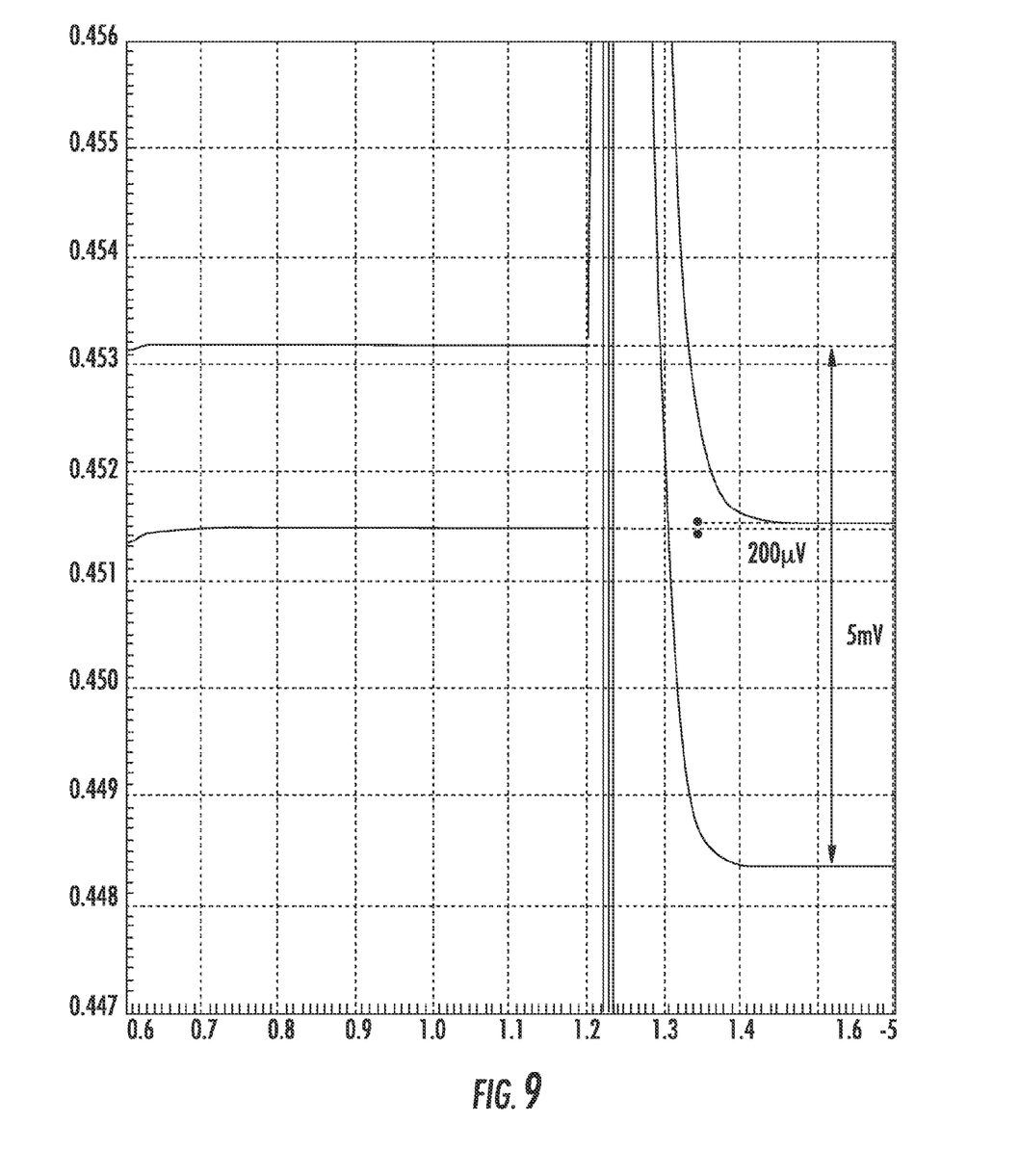
FIG. 9 shows an enlarged section of the diagram of FIG. 8.

The enlargement of the diagram of FIG. 8, which can be seen in FIG. 9, shows that the typical circuit of FIG. 6 has the output voltage Vout, at the output terminal Out of the circuit 30, which departs by a value equal to 5 mV, between the case of input voltage of common mode equal to zero and the case in which this is equal to 13.6V, which, in decibels, represents about −68 dB. While, with the sensing circuit 100, according to the present disclosure, the output voltage Vout at the output terminal Out shows a variation of only 200 uV, under the same conditions, which correspond to −97 dB. According to this particular simulation, it is derived that the sensing circuit 100 according to the present disclosure allows a gain of about 30 dB.

It is to be noted that the sensing circuit, realized according to the present disclosure, allows considerable improvement to the performance when a differential voltage Vdiff is applied above the input signal of common mode. In fact, the third transconductance amplifier Gm3 allows for balancing the inbalance present at the output terminals of the first transconductance amplifier Gm1.

In this way, by using current sensing circuits according to the present disclosure, in current loop control devices with PWM currents, an improvement in the performance is obtained. In particular, in applications where the reading is provided for data stored in storage support services, for example, a hard disk drive, the circuits according to the present disclosure allow for considerable improvement in the performance during the operations of track seek, operations in which the input differential voltage Vdiff at the extremities of the sensing resistance Rs is different from zero. The sensing circuit 100, according to the present disclosure, also maintains excellent performance even during the track following current operations, operations in which the input differential voltage Vdiff is equal to 0V, thus ensuring the maximum accuracy.

Figure 10:
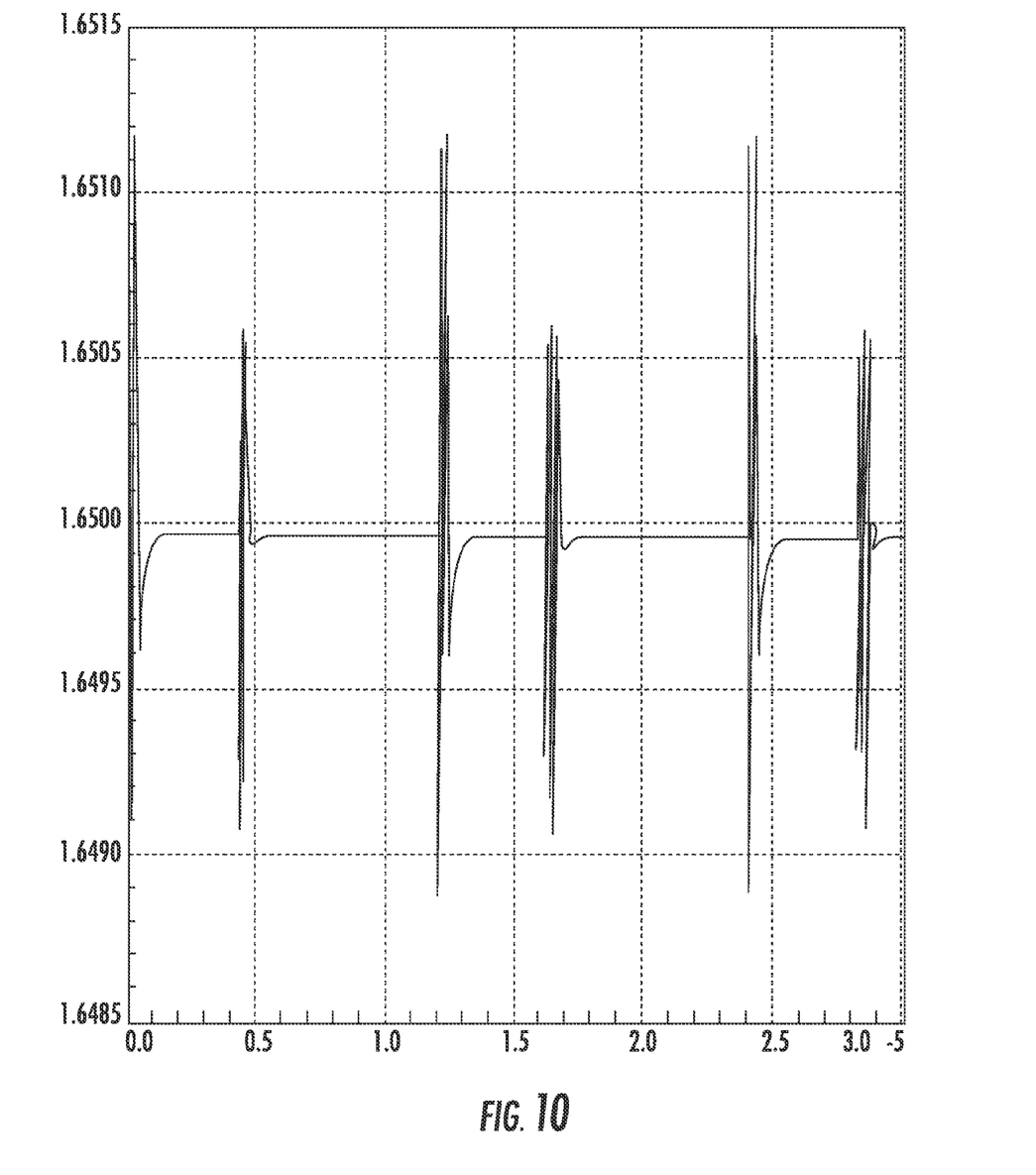
FIG. 10 shows another comparison of the output voltage of the circuit of FIG. 6 and of the circuit according to the present invention.

This has been confirmed by further tests carried out by Applicant and reported in the diagram of FIG. 10. In particular, the diagram shows the progress of the output voltage Vout of the sensing circuit 100, realized according to the present disclosure, and of the known circuit 30 of FIG. 6, with an input voltage substantially equal to 1.6500 V.

From this diagram, it can be observed how both in the prior art circuit 30 and in the sensing circuit 100 according to the present disclosure, with a differential voltage Vdiff at the input substantially equal to zero, the output voltage Vout remains substantially constant. This confirms that the worst case occurs when a differential signal Vdiff is applied at the input. Applicant has also found that, with use of the sensing circuit 100 realized according to the present disclosure, possible spikes at the high operation frequencies due to the output switches are kept to a minimum, with values of about 10 mV peak-peak.

The herein disclosed process for sensing a current for PWM applications with pulse width modes comprises the steps of: sensing a current that flows in a sensing resistance Rs by way of an input block 110, of a sensing circuit 100, the input block 110 comprising a first transconductance amplifier Gm1; processing the current sensed by way of an amplifier block 120 comprising an operational amplifier OP connected to the input block 110 and to an output terminal Out of the sensing circuit 100; and feedback driving the amplifier block 120 by way of a feedback block 130 comprising a second transconductance amplifier Gm2, the amplifier block 120 being interposed between the output terminal Out and the amplifier block 120. Advantageously, according to the present disclosure, the step of sensing the current that flows in the sensing resistance Rs provides for use of a third transconductance amplifier Gm3 placed in cascade to the first transconductance amplifier Gm1 and coupled to the amplifier block 120.

Suitably, the process according to the present disclosure provides for arranging the first transconductance amplifier Gm1 and the second transconductance amplifier Gm2 realized by way of low voltage transistors and the third transconductance amplifier Gm3 realized with high voltage transistors. Moreover, the process provides for biasing a first transistor T1 and a second transistor T2, suitable for realizing the first transconductance amplifier Gm1, of the input block 110, by way of a first biasing element 60. The first biasing element 60 suitably biases the respective first conduction terminals s1, s2 of the first transistor T1 and of the second transistor T2. The first biasing element 60 is coupled to the supply voltage Vcc and to the ground terminal Gnd.

Moreover, the process provides for biasing a sixth transistor T6 and a seventh transistor T7, suitable for realizing the second transconductance amplifier Gm2, of the feedback block 130, by way of a second biasing element 70. The second biasing element 70 suitably biases the respective first conduction terminals s6, s7 of the sixth transistor T6 and of the seventh transistor T7. The second biasing element 70 is coupled to the supply voltage Vcc and to the ground terminal Gnd.

An advantage of the circuit and of the current sensing process, realized according to the present disclosure, is the improvement of in the CMRR of the circuit itself. In fact, the third transconductance amplifier Gm3 placed in cascade to the first transconductance amplifier Gm1 allows for balancing the switches of the differential voltage Vdiff sensed at the first and at the second input terminal IN1 and IN2 of the sensing circuit 100 itself, in turn connected across the sensing resistance Rs. This ensures, independently from the value of the current present at the input terminals IN1 and IN2, of the sensing circuit 100, a constant output voltage Vout.

A further advantage of the circuit and of the method realized according to the present disclosure is given by the excellent performance at the high frequencies. In fact, the first biasing element 60, of the input block 110 and the second biasing element 70, of the feedback block 130, define a low impedance which, although coupled to possible parasite capacities present in the sensing circuit 100, maintaining the excellent performance also at the high operating frequencies.

Another considerable advantage of the current sensing circuit 100 according to the present disclosure is that it allows for realizing the first transconductance amplifier Gm1 and the second transconductance amplifier Gm2 as low voltage devices and to exclusively realize the third transconductance amplifier Gm3 as high voltage device, thus avoiding increases in the silicon area occupied by the current sensing circuit 100.

Another advantage is that the current sensing circuit 100 avoids an increase in the total input offset. The first transistor T1 and the second transistor T2 of the first transconductance amplifier Gm1 allow the offset due to the presence of the third transconductance amplifier Gm3 and do not affect the determination of the stage total offset, i.e. of the sensing circuit 100.

That which is claimed:

1. A current sensing circuit for a pulse width modulation (PWM) application comprising:
   first and second input terminals to be coupled to ends of a sensing resistance;
   an output terminal;
   first and second internal circuit nodes;
   an input block comprising a first transconductance amplifier to be coupled to a supply voltage, and said first transconductance amplifier coupled to said first and second input terminals and to said first and second internal circuit nodes;
   an amplifier block comprising an amplifier to be coupled to a reference voltage, and coupled to said first and second internal circuit nodes and said output terminal; and
   a feedback block comprising a second transconductance amplifier to be coupled to the supply voltage and being coupled to said output terminal and said first and second internal circuit nodes;
   said input block further comprising a third transconductance amplifier coupled in cascade to said first transconductance amplifier and to said first and second input terminals, said first, second, and third transconductance amplifiers each comprising transistors, the transistors of said third transconductance amplifier operating at a voltage greater than that of the transistors in said first and second transconductance amplifiers.

2. The current sensing circuit according to claim 1 wherein said first transconductance amplifier and said second transconductance amplifier each comprise low voltage transistors; and wherein said third transconductance amplifier comprises high voltage transistors.

3. The current sensing circuit according to claim 1 wherein said first transconductance amplifier comprises first and second transistors, each of said first and second transistors having a first conduction terminal to be coupled to the supply voltage; wherein said third transconductance amplifier comprises a third transistor and a fourth transistor respectively coupled in cascade to said first transistor and to said second transistor; wherein said third transistor and said fourth transistor each have a command terminal respectively coupled to said first input terminal and to said second input terminal; and wherein said third transistor and said fourth transistor have second conduction terminals coupled respectively to said first internal circuit node and to said second internal circuit node.

4. The current sensing circuit according to claim 3 wherein said first transistor and said second transistor each comprise a bulk terminal to be coupled to the supply voltage; and wherein said third transistor and said fourth transistor each have a bulk terminal coupled respectively to said bulk terminals of said first and second transistors.

5. The current sensing circuit according to claim 3 wherein said input block comprises:
   a first resistor coupled to said first transistor and to said third transistor; and
   a second resistance coupled to said second transistor and to said fourth transistor.

6. The current sensing circuit according to claim 3 wherein said input block comprises a first bias element to be coupled to the supply voltage and to the reference voltage to bias said first conduction terminals of said first and said second transistors.

7. The current sensing circuit according to claim 6 wherein said first bias element comprises a fifth transistor.

8. The current sensing circuit according to claim 6 wherein said second transconductance amplifier comprises sixth and seventh transistors, each of said sixth and seventh transistors having a first conduction terminal; and wherein said feedback block comprises a second bias element to be coupled to the supply voltage and the reference voltage to respectively bias said first conduction terminals of said sixth and seventh transistors of said second transconductance amplifier.

9. The current sensing circuit according to claim 8 wherein said second bias element comprises an eighth transistor.

10. A current loop control device for driving coils in a voice coil motor using a sensing resistor associated with the coils, the current loop control device comprising:
first and second input terminals to be coupled to ends of a sensing resistance;
an output terminal;
first and second internal circuit nodes;
an input block comprising a first transconductance amplifier to be coupled to a supply voltage, and said first transconductance amplifier coupled to said first and second input terminals and to said first and second internal circuit nodes;
an amplifier block comprising an amplifier to be coupled to a reference voltage, and coupled to said first and second internal circuit nodes and said output terminal; and
a feedback block comprising a second transconductance amplifier to be coupled to the supply voltage and being coupled to said output terminal and said first and second internal circuit nodes;
said input block further comprising a third transconductance amplifier coupled in cascade to said first transconductance amplifier and to said first and second input terminals, said first, second, and third transconductance amplifiers each comprising transistors, the transistors of said third transconductance amplifier operating at a voltage greater than that of the transistors in said first and second transconductance amplifiers.

11. The current loop control device according to claim 10 wherein said first transconductance amplifier and said second transconductance amplifier each comprise low voltage transistors; and wherein said third transconductance amplifier comprises high voltage transistors.

12. The current loop control device according to claim 10 wherein said first transconductance amplifier comprises first and second transistors, each of said first and second transistors having a first conduction terminal to be coupled to the supply voltage; wherein said third transconductance amplifier comprises a third transistor and a fourth transistor respectively coupled in cascade to said first transistor and to said second transistor; wherein said third transistor and said fourth transistor each have a command terminal respectively coupled to said first input terminal and to said second input terminal; and wherein said third transistor and said fourth transistor have second conduction terminals coupled respectively to said first internal circuit node and to said second internal circuit node.

13. The current loop control device according to claim 12 wherein said first transistor and said second transistor each comprise a bulk terminal to be coupled to the supply voltage; wherein said third transistor and said fourth transistor each have a bulk terminal coupled respectively to said bulk terminals of said first and second transistors.

14. A pulse width modulation (PWM) current sensing method comprising:
sensing a current in a sensing resistor using an input block of a sensing circuit, the input block comprising a first transconductance amplifier;
processing the sensed current using an amplifier block comprising an amplifier, the amplifier block being coupled to the input block and to an output terminal of the sensing circuit;
feedback driving the amplifier block using a feedback block comprising a second transconductance amplifier, the feedback block being coupled to the output terminal and to the amplifier block; and
using a third transconductance amplifier coupled in cascade to the first transconductance amplifier and to the amplifier block to sense the current in the sensing resistor, the third transconductance amplifier comprising transistors operating at a voltage greater than that of transistors in the first and second transconductance amplifiers.

15. The process according to claim 14 wherein the first transconductance amplifier and the second transconductance amplifier comprise low voltage transistors; and wherein the third transconductance amplifier comprises high voltage transistors.

16. The process according to claim 14 further comprising:
biasing a first transistor and a second transistor of the first transconductance amplifier using a first bias element; and
biasing a sixth transistor and a seventh transistor of the second transconductance amplifier using a second bias element.

17. A current loop control device for driving coils in a voice coil motor using a sensing resistor associated with the coils, the current loop control device comprising:
first and second input terminals to be coupled to ends of a sensing resistance;
an output terminal;
first and second internal circuit nodes;
an input block comprising a first transconductance amplifier to be coupled to a supply voltage, and said first transconductance amplifier coupled to said first and second input terminals and to said first and second internal circuit nodes;
an amplifier block comprising an amplifier to be coupled to a reference voltage, and coupled to said first and second internal circuit nodes and said output terminal; and
a feedback block comprising a second transconductance amplifier to be coupled to the supply voltage and being coupled to said output terminal and said first and second internal circuit nodes;
said input block further comprising a third transconductance amplifier coupled in cascade to said first transconductance amplifier and to said first and second input terminals;
said first transconductance amplifier and said second transconductance amplifier comprising low voltage transistors, said third transconductance amplifier comprising high voltage transistors.

18. The current loop control device according to claim 17 wherein said first transconductance amplifier comprises first and second transistors, each of said first and second transistors having a first conduction terminal to be coupled to the supply voltage; wherein said third transconductance amplifier comprises a third transistor and a fourth transistor respectively coupled in cascade to said first transistor and to said second transistor; wherein said third transistor and said fourth transistor each have a command terminal respectively coupled to said first input terminal and to said second input terminal; and wherein said third transistor and said fourth transistor have second conduction terminals coupled respectively to said first internal circuit node and to said second internal circuit node.

19. The current loop control device according to claim 18 wherein said first transistor and said second transistor each comprise a bulk terminal to be coupled to the supply voltage; wherein said third transistor and said fourth transistor each have a bulk terminal coupled respectively to said bulk terminals of said first and second transistors.

20. A pulse width modulation (PWM) current sensing method comprising:

sensing a current in a sensing resistor using an input block of a sensing circuit, the input block comprising a first transconductance amplifier;

processing the sensed current using an amplifier block comprising an amplifier, the amplifier block being coupled to the input block and to an output terminal of the sensing circuit;

feedback driving the amplifier block using a feedback block comprising a second transconductance amplifier, the feedback block being coupled to the output terminal and to the amplifier block; and using a third transconductance amplifier coupled in cascade to the first transconductance amplifier and to the amplifier block to sense the current in the sensing resistor, the first transconductance amplifier and the second transconductance amplifier comprising low voltage transistors, the third transconductance amplifier comprising high voltage transistors.

21. The process according to claim 20 further comprising:

biasing a first transistor and a second transistor of the first transconductance amplifier using a first bias element; and biasing a sixth transistor and a seventh transistor of the second transconductance amplifier using a second bias element.

\* \* \* \* \*